United States Patent [19]

Dillon et al.

[11] Patent Number: 5,241,548

[45] Date of Patent: Aug. 31, 1993

[54] METHOD FOR ERROR CORRECTION OF A TRANSMITTED DATA WORD

[75] Inventors: Thomas M. Dillon, Chicago; Robert K. Krolopp, Lisle; Michael P. Metroka, Algonquin, all of Ill.

[73] Assignee: Motorola, Inc., Schaumburg, Ill.

[21] Appl. No.: 704,508

[22] Filed: May 23, 1991

[51] Int. Cl.⁵ .............................. H04L 1/08
[52] U.S. Cl. ................. 371/69.1; 371/36; 371/67.1; 375/22; 375/95; 375/116
[58] Field of Search ............. 371/69.1, 36, 32, 33, 371/35, 62; 375/116, 95, 22

[56] References Cited

U.S. PATENT DOCUMENTS

| | | | |
|---|---|---|---|
| 4,312,074 | 1/1982 | Pautler et al. | 375/96 |
| 4,613,900 | 9/1986 | Halpern | 455/33 |
| 4,649,543 | 3/1987 | Levine | 371/41 |
| 4,654,867 | 3/1987 | Labedz et al. | 379/59 |
| 4,670,880 | 6/1987 | Jitsukawa et al. | 371/36 |
| 4,984,290 | 1/1991 | Levine et al. | 455/33 |
| 5,036,532 | 7/1991 | Metroka et al. | 379/58 |

*Primary Examiner*—Robert W. Beausoliel, Jr.
*Assistant Examiner*—Ly V. Hua
*Attorney, Agent, or Firm*—Kenneth W. Bolvin

[57] ABSTRACT

The process of the present invention error corrects sub-audible data words that have been transmitted over a voice channel. A data word may be transmitted up to three times if an acknowledge is not received by the transmitter. If any of the three possible repeats of the received data word are decodable, an acknowledgment is transmitted. If all three repeats of the data word contain uncorrectable errors, a bitwise majority vote is performed on the three data words. If the result of the majority vote is decodable, an acknowledgement is transmitted to the sender.

6 Claims, 5 Drawing Sheets

FIG.1
| FROM TRANSMITTING UNIT | | | |
|---|---|---|---|
| DSAT | WORD SYNC | DATA WORD | DSAT |
| FROM RECEIVING UNIT | | |
|---|---|---|
| DSAT | WORD SYNC | DATA WORD(=ACK) |
FIG.5
```
10101111  11001010  00000010  01111110  10000011  TRANSMITTED DATA WORD
X01011X1  11001X10  XX00001X  0X111110  10XX0011  RECEIVED WORD 1
101X1111  11X01010  000X00X0  01X11X10  1000001X  RECEIVED WORD 2    X=ERROR
10101111  X10X10XX  00X00010  011X1110  1000X011  RECEIVED WORD 3
10101111  11001010  00000010  01111110  10000011  ERROR CORRECTED RESULT
                                           ↑
                                          701
```
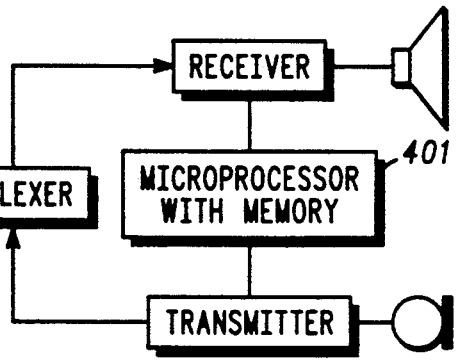
FIG.4
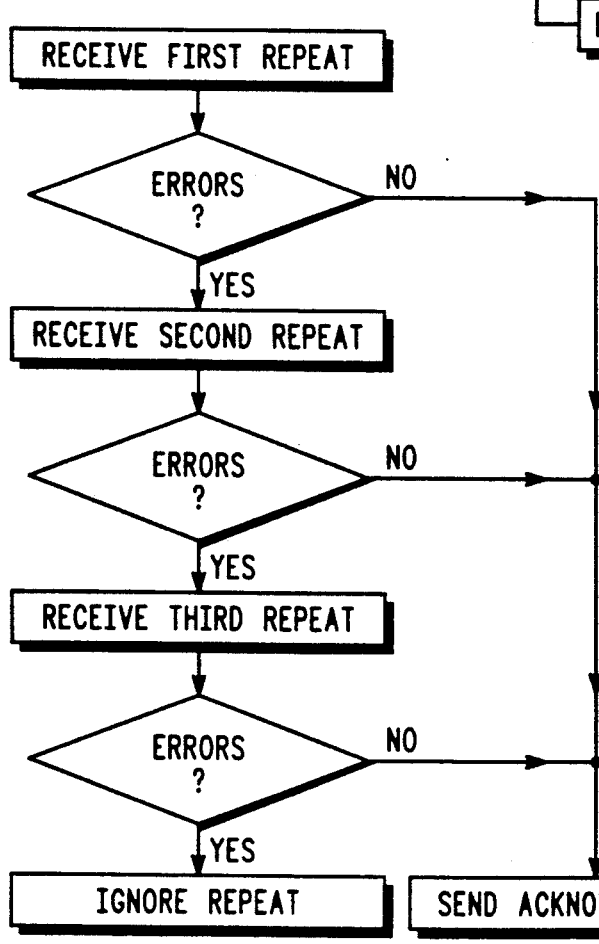
FIG.2
— PRIOR ART —

REPEAT COUNTER: 0

REPEAT COUNTER: 0

REPEAT COUNTER: 0

METHOD FOR ERROR CORRECTION OF A TRANSMITTED DATA WORD

FIELD OF THE INVENTION

The present invention relates generally to the field of communications and particularly to error correction of sub-audible data words transmitted over a radio frequency channel.

BACKGROUND OF THE INVENTION

While operating in a cellular radiotelephone system, data messages are continuously transmitted between a radiotelephone and a base station. These messages include orders requesting the radiotelephone transceiver to change transmit power level, to change channel assignment, to release the call, or other similar requests. Some of these data messages are sent on the forward and reverse voice channels. In systems using subaudible data, the messages are interleaved in a continuous stream of data. A system as described in U.S. Pat. No. 4,984,290 (Levine et al.), assigned to the assignee of the present invention, is an example of such a system. Narrowband Advanced Mobile Service (NAMPS) is another example of such a system and is described in more detail in Motorola NAMPS Air Interface Specification Revision D, available from the assignee of the present invention. FIG. 1 and sections 2.7.2.2 and 3.7.2.2 of the above specification give a more detailed description of the forward and reverse voice channels. The format of the messages transmitted on both the forward and reverse channels is identical, the difference between the two channels is the data word format.

The data word format used on the narrow forward voice channel (base to radiotelephone) consists of 28 bits of content encoded into a (40,28) error correcting Bose-Chaudhuri-Hocquenghem (BCH) coded Manchester modulated data word with a distance of five sent at 100 bits/second. The BCH code allows for the correction of one bit error and is a shortened version of the standard (63,51) BCH code. The forward voice channel message is transmitted after a single transmission of a 30 bit word synchronization pattern sent at 200 bits/second using non-return to zero (NRZ) modulation. Four errors are allowed in the synchronization pattern. Bit synchronization is accomplished by receiving one of seven 24-bit continuously transmitted 200 bits/second Digital Supervisory Audio Tone (DSAT) sequences and maintaining synchronization to it. A (48,36) BCH coded Manchester modulated data word is used on the narrow reverse voice channel (radiotelephone to base). The reverse voice channel message is similarly transmitted after a single transmission of a 30 bit word synchronization pattern. Bit synchronization on the reverse voice channel is accomplished with a DSAT sequence similar to that of the forward voice channel.

Instead of multiple repeats, as used in some typical cellular systems, an automatic repeat request procedure (ARQ) is implemented for fading protection. NAMPS messages are transmitted only once with ARQ due to the low baud rate of the subaudible data. When a subaudible data word is received, an acknowledgement is sent by the receiving unit to the transmitting unit as is illustrated in FIG. 1. The message may be transmitted a total of three times if an acknowledgement is not received by the sending unit. This process is illustrated in FIG. 2.

If the radiotelephone is in a low signal level, multipath, or Rayleigh fading environment, the data word may contain uncorrectable errors when it is received. As shown in FIG. 2, if the message is received three times with uncorrectable errors, the message is ignored and no acknowledgement is sent. There is a resulting need to correct these uncorrectable errors, thereby reducing the message error rate for subaudible data communications.

SUMMARY OF THE INVENTION

The process of the present invention error corrects sub-audible data words that have been transmitted over a voice channel. If any of the three received possible transmissions of the data word is decodable, an acknowledgement is transmitted to the sender. If the data words were received three times with uncorrectable errors, a bitwise majority vote is performed on the three words. If the result from this operation can be decoded, an acknowledgement is transmitted to the sender. An algorithm is used to prevent inappropriate utilization of the majority vote process.

BRIEF DESCRIPTION OF THE DRAWINGS

FIG. 1 shows the format of the narrow analog forward and reverse voice channel subaudible data streams.

FIG. 2 shows a flowchart of the prior art process of receiving and acknowledging subaudible data words on a narrow voice channel.

FIG. 4 shows a block diagram of a typical radiotelephone in accordance with the present invention.

FIG. 5 shows an example of the operation of the bitwise majority vote used in the process of the present invention.

FIG. 6 comprising

DETAILED DESCRIPTION OF THE PREFERRED EMBODIMENT

The process of the present invention reduces the message error rate for subaudible data words transmitted on a voice channel of a cellular communication system. This is accomplished by performing a bitwise majority vote on three received data words that contain more than one uncorrectable error. To prevent inappropriate use of the majority vote scheme, the algorithm incorporates two timers and a message repeat counter.

The message repeat counter is used to count the received transmission of a data message. This counter is incremented if a synchronization pattern is decoded but the data word has uncorrectable errors. When the counter reaches a value of three within the expected time for three transmissions, the majority vote operation is performed. The counter is reset after arriving on a voice channel, sending an ACK, when the hole or window timers expire or when the majority vote fails.

DSAT may be lost due to a fade or a transition to a synchronization pattern. A hole timer measures the time elapsed after DSAT is lost. When DSAT is reaquired, the timer is evaluated. If the elapsed time is greater than the time it takes to receive a combined synchronization pattern and data word (message) but less than the DSAT loss time, it is assumed that a message may have been sent and the message repeat counter is reset. If DSAT is lost for five or more seconds, the cellular telephone call is terminated.

A window timer runs for the time it takes to receive two messages. The window timer is started when the first transmission of a message is detected. This timer is then active for the approximate length of time it takes to receive two additional messages. If the message repeat counter has not reached three prior to the window timer expiring, the message repeat counter and window timer are reset.

Figure 3A:
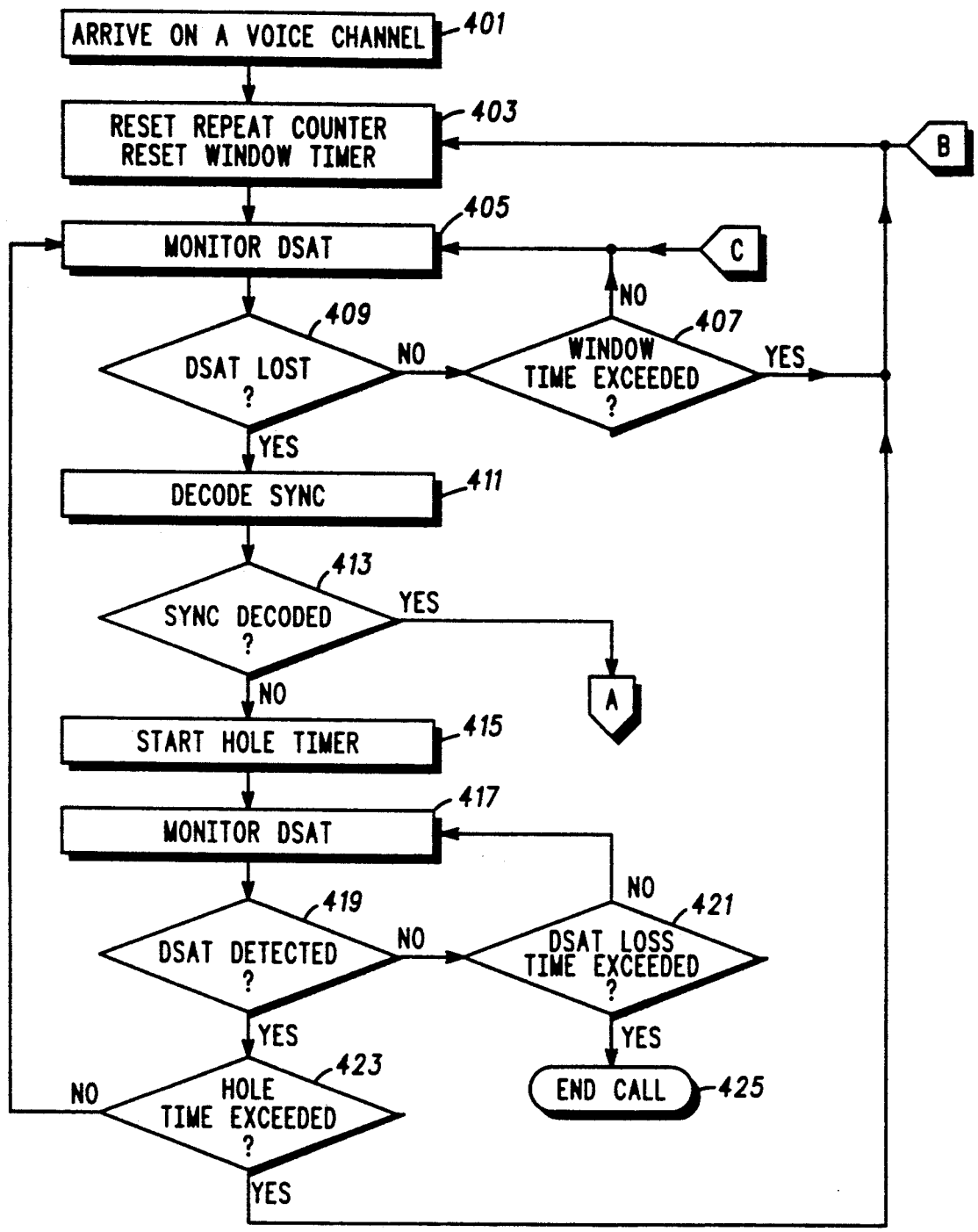
FIGS. 3A and B show a flowchart of the process of the present invention.

A flowchart of the process of the present invention is illustrated in FIGS. 3A and B. Referring to FIG. 3A, the process begins when the radiotelephone arrives on a narrow voice channel (401) and resets the message repeat counter and window timer (403). The radiotelephone then monitors DSAT (405). If DSAT is not lost (409), the window timer is checked to determine if the window time is exceeded (407). If the window time is exceeded, the message repeat counter and window timer are reset (403). If the window time is not exceeded, DSAT is monitored (405). If DSAT is lost (409), an attempt is made to decode a synchronization pattern (411). If a synchronization pattern is decoded (413), the process receives a data word (501). If no synchronization pattern is decoded (413), the DSAT hole timer is started (415). The process monitors the incoming data stream for the DSAT pattern to return (417). If DSAT is not detected (419), the DSAT hole timer is checked to determine if the DSAT loss time has been exceeded (421). If the DSAT loss time is exceeded, the call is terminated (425). If the DSAT loss time is not exceeded, DSAT is monitored (417). If DSAT is detected (419), the hole timer is checked (423) to determine if the hole time is exceeded. If the hole time is exceeded, the message repeat counter and window timer are reset (403) and the process returns to monitor DSAT (405). If the hole time is not exceeded, the process returns to monitor DSAT (405).

Figure 3B:
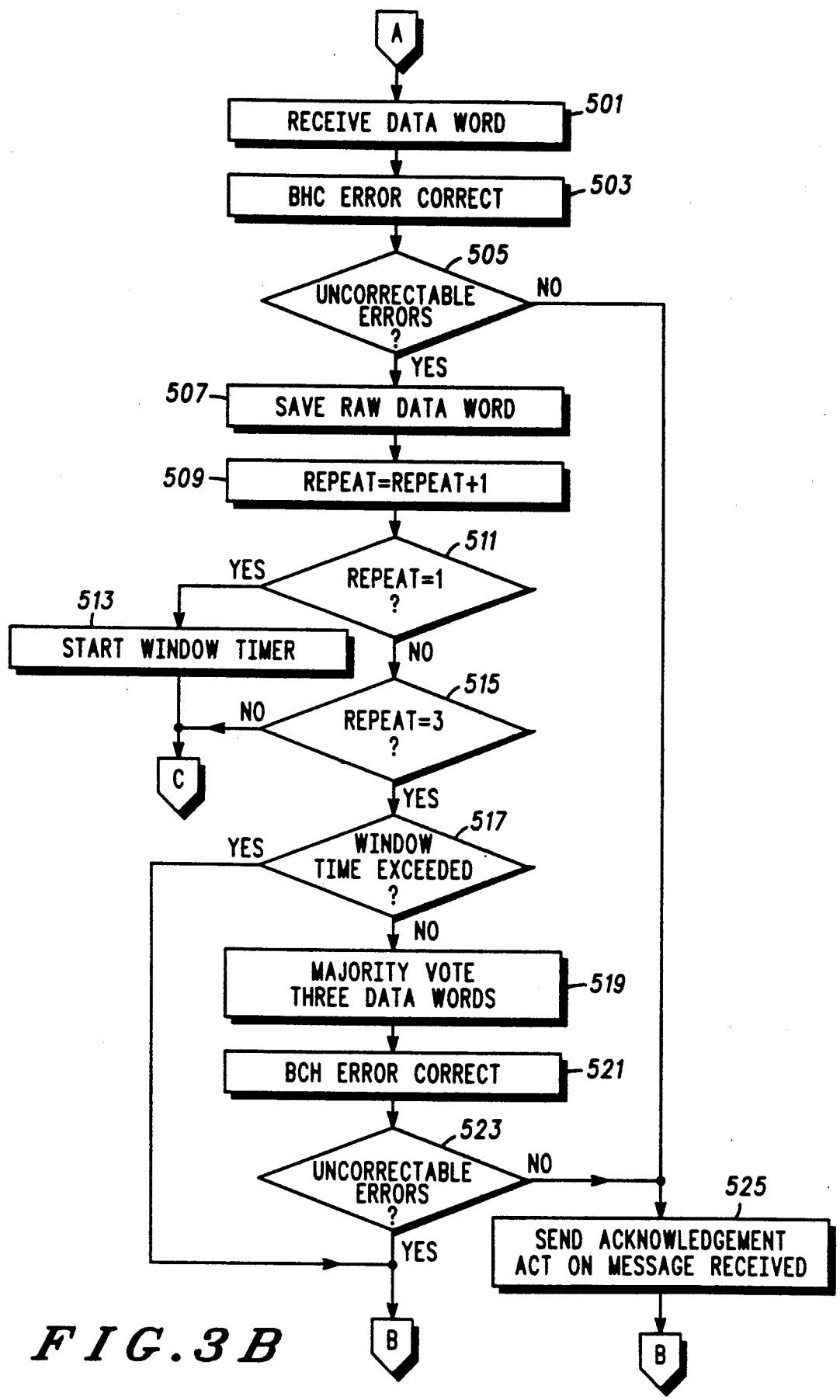

The process of the present invention continues in FIG. 3B when the radiotelephone receives the first subaudible data word preceded by a synchronization pattern (501) and performs BCH error correction (503). If no uncorrectable errors are found (505), the radiotelephone transmits an acknowledgement (ACK) to the base (525). The ACK is described in the Motorola NAMPS Air Interface Specification Revision D in sections 2.4.5.1, 2.4.5.2, 2.4.5.8 and 2.7.2.2. The radiotelephone will then act on the message received and reset the repeat counter and window timer (403). If the word contains uncorrectable errors, the raw word is stored (507) and no ACK is sent to the base station. The data word message repeat counter is then incremented by one (509). This counter is checked to determine if this is the first transmission of the current data word (511). Since this is the first transmission, the window timer is started (513) and the process returns to monitor DSAT (405).

After an appropriate time interval, the base station repeats the message. The radiotelephone then receives the repeat of the data word (501) and performs BCH error correction (503). If no uncorrectable errors are found (505), the radiotelephone transmits an ACK to the base and acts on the message received (525). If the word contains uncorrectable errors, it is stored (507) and no ACK is sent. The message repeat counter is incremented again (509). The counter is checked to determine if this is the first transmission of this message (511) and to determine if three data words have been stored (515). If three data words with uncorrectable errors have not yet been stored, the process again returns to monitor DSAT (405).

The radiotelephone receives the last repeat of the data word (501) and performs BCH error correction (503). If no uncorrectable errors are found (505), the radiotelephone transmits an ACK to the base and acts on the message received (525). If this word contains uncorrectable errors, it is stored (507), the message repeat counter is incremented (509), and checked to determine if this is the first transmission of this message (511) and to determine if three words have been stored (515). Now that the three words have been stored, the window timer is checked to determine if the window time has been exceeded (517). If the window time has been exceeded, the message repeat counter and window timer are reset (403) and the process returns to monitor DSAT (405). If the window time has not been exceeded, a two-out-of-three majority vote is performed on the three stored words (519). The boolean formula for the majority vote operation is as follows:

error corrected
result=(word1*word2)+(word1*word3)+-(word2*word3).

An example of the majority vote process is illustrated in FIG. 5. The first line shows the error free transmitted data word sent by the base station. The next three lines show the data words as received by the radiotelephone. It can be seen that these words contain uncorrectable errors, each error designated by an "x", in various locations. Starting as bit position 0(701) of the data words, the majority vote of the process of the present invention logically ANDs the logical 1 of word1 with the error (logical 0) of word2. This results in a logical value of 0. Next, the logical 1 of word1 is logically ANDed with the logical 1 of word3 resulting in a logical 1. Last, the error of word2 is logically ANDed with the logical 1 of word3 resulting in a logical 0. The logical results of the ANDing operations are then logically ORed to produce an error free logical 1 for bit position 0. These bitwise logical operations, using the above boolean formula, are represented as:

$$\text{error corrected bit result} = (1 * 0) + (1 * 1) + (0 * 1)$$
$$= 0 + 1 + 0$$
$$= 1.$$

This operation is repeated for each bit position of the three data words. If an error is contained in the same bit position on two or three of the repeats, the error will be contained in the resulting voted word. If only one error is contained in the voted result, it will be corrected by the BCH decoder.

The result of the majority vote operation then goes through BCH error correction (521) which can correct one bit error. If the process of the present invention produces a result that can be decoded by the radiotelephone (523), an ACK is transmitted to the sender and the message is acted upon (525). If the result of the process does not produce a decodable result, the message repeat counter and window timer are reset (403)

and the data word is ignored. The process then returns to monitor DSAT (405).

Figure 6A:
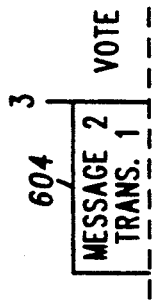
FIG. 6A, FIG. 6B and FIG. 6C, shows examples of the operation of the message repeat counter and window timer used in the present invention.
Figure 6A:
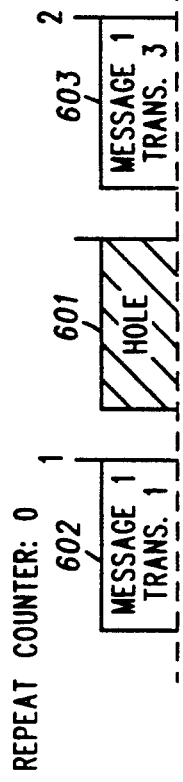

FIG. 6A shows what would happen if a window timer were not used. Although three transmissions of message 1 were attempted, the second transmission of message 1 was lost, thus causing the hole (601). The message repeat counter would not be reset and the two received transmissions of message 1 (602 and 603) would be majority voted with the first received transmission of message 2 (604). If this occurs, message 1 will be missed and there will be no possibility for message 2 to be majority voted.

Figure 6B:
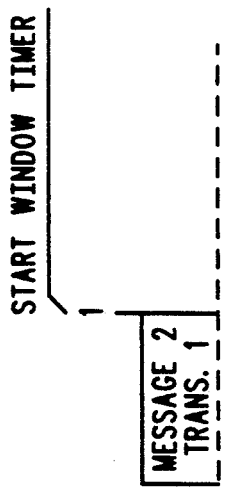
Figure 6B:
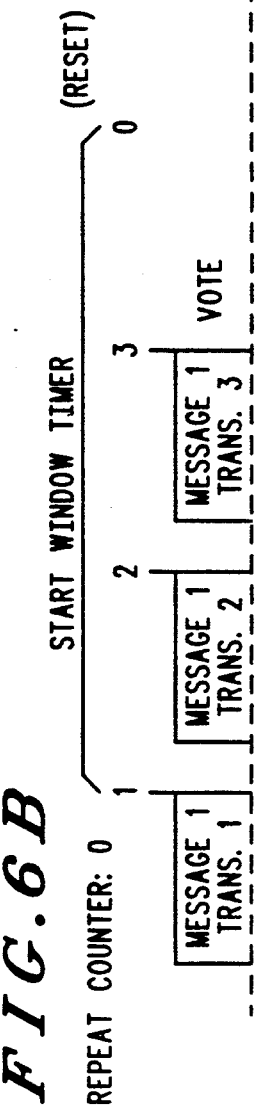

An example of the operation of the window timer and message repeat counter is shown in FIG. 6B. To prevent improper utilization of the majority vote operation, the majority vote is only used when the message repeat counter is equal to three and the window timer is active and not timed out.

Figure 6C:
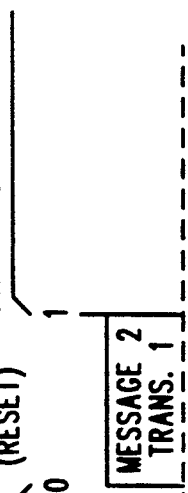
Figure 6C:
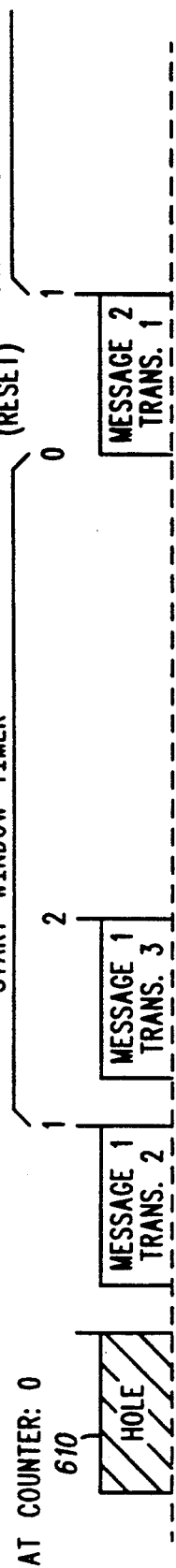

FIG. 6C illustrates a case where one of the three transmissions of a message is missed (610). The message repeat counter does not reach a value of three before the window timer times out and no vote occurs. Although message 1 is missed, message 2 may still be received.

The following calculation determines the NAMPS Message Error Rate taking into account the transmission and detection of both the synchronization word and the (40,28) modified BCH encoded data word.

Synchronization in the NAMPS system is accomplished by the detection of a 30-bit synchronization word having the following sequence: "195A99A6". This synchronization word is sent at 200 bps, is NRZ coded, and its decoding allows for up to four bit errors. Upon successful synchronization to the synchronization word, the (40,28) BCH Manchester coded data word, which is sent at 100 bps, is detected. The Manchester coded data is used for the BCH coded words and the NRZ coded data is used for the synchronization word.

The average static bit error rate can be shown to be a function of the received RF signal level. As the RF signal level is increased, the average static bit error rate decreases. For a given average static bit error rate for the 200 bps NRZ coded synchronization word, the probability of a successful synchronization detect, allowing for four or fewer errors, is Psd.

$$Psd = (1-P2b)^{30} + 30\ P2b(1-P2b)^{29} + 435\ P2b^2(1-P2b)^{28} + 4060\ P2b^3(1-P2b)^{27} + 27405\ P2b^4(1-P2b)^{26}$$

After successful synchronization word, the data word is read in. The probability of a word error is Pword.

$$Pword = 1 - (1-Pb)^{40} - 40\ Pb\ (1-Pb)^{39}$$

The probability of a message error without the ARQ is Pws. It is a function of both synchronization and BCH word detection. Pws is also the probability of a message error occurring during the first ARQ attempt.

$$Pws = 1 - (Psd)(1-Pword)$$

The ARQ is taken into account by assuming that the three message attempts are independent of each other. Pmer2$^{nd}$ is the probability of a message error for both the combined first and second ARQ attempt.

$$Pmer2^{nd} = (Pws)^2$$

Pmer is the probability of message error with all three message attempts taken into account.

$$Pmer = (Pws)^3$$

Figure 7:
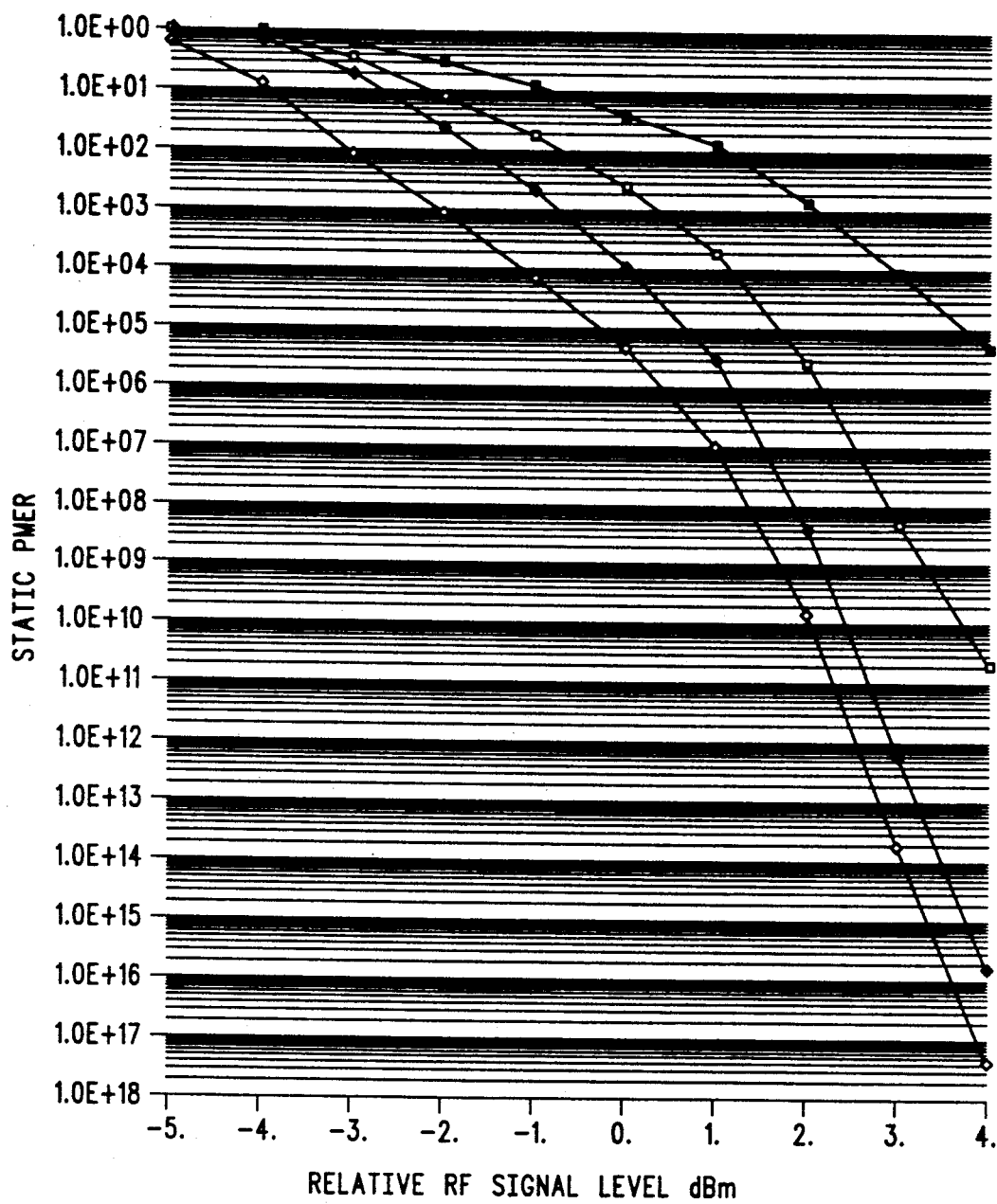
FIG. 7 shows message error probability plots for the prior art and present invention.

The probability of a message error during the first attempt, the combined first and second ARQ attempt, and the combined first, second and third ARQ attempt in the NAMPS system, with respect to received RF signal level, have been plotted in FIG. 7.

The following calculation determines the NAMPS Message Error Rate further taking into account the redundancy scheme of the present invention which makes use of two-out-of-three majority-vote post processing on each bit. Also taken into account is the correlation between ARQ decoder failure and the majority-vote process.

The standard static NAMPS ARQ message error probability remains as stated above. Should the three (ARQ) message attempts fail to detect a valid data word, then a final attempt can be made to recover the message by doing a bit-by-bit two-out-of-three majority-vote on the three received data words. For the mobile to realize that it failed to detect any of the three ARQ attempts implies a special condition in which the bit error rate was high enough to produce at least two errors in each of the individual three word attempts but not high enough to prohibit synchronization to the synchronization word. With at least two bits in error for each forty bit data word, this results in a per bit error rate probability (Pbw) of at least 0.05 even when the channel bit error rate is less than 0.05. Therefore, for the calculation the value of Pbw is set to 0.05 for all Pb<0.05.

Applying two-out-of-three voting on each of the individual bits in the three 40 bit words results in the improved bit error rate Pb$_{2\ of\ 3}$.

$$Pb_{2\ of\ 3} = 3\ Pbw^2(1-Pbw) + Pbw^3$$

where:
Pbw=Pb for Pb>0.05 and
Pbw=0.05 for Pb≦0.05

The above calculation can not use the same bit error probability Pb from the earlier calculations that were used for the standard ARQ calculations. This is because the bit error probability Pbw is now related to the failure of the standard ARQ algorithm which forces the post processing to be conducted. In other words, the bit error probability Pbw may be statistically much worse than the channel bit error probability Pb, because the failure of the error control coding on these words which allows the majority vote to proceed biases Pbw.

With the calculation of Pbw in the majority-voted word, the probability of a word error allowing for one bit of error correction is P'word.

$$P'word = 1 - (1-Pb_{2\ of\ 3})^{40} - 40\ Pb_{2\ of\ 3}(1-Pb_{2\ of\ 3})^{39}$$

The combined message error probability using standard ARQ and majority voting is P'mer is then calculated using:

$$P'mer = (Pws)^3\ (P'word)$$

The probability of a message error including the above improvements (P'mer) for the NAMPS system has been plotted in FIG. 7 for comparison to the message error rates of the standard NAMPS system. As illustrated in FIG. 7, the NAMPS message error rate employing the two-out-of-three majority-voting scheme of the present invention provides improved message error rates over the original NAMPS scheme.

The preferred embodiment of the process of the present invention is performed by the microprocessor (410) of a radiotelephone or other communication device, however, the process could be performed by hardware. A simple block diagram of a typical radiotelephone is illustrated in FIG. 4 and described in Motorola Micro T.A.C manual #68P81150E49 available from the assignee of the present invention.

In summary, the process of the present invention can derive a decodable data word from three received data words having uncorrectable errors. As seen by the above calculations and graph, this improves the message error rate on narrow analog voice channels.

We claim:

1. A method for error correction of a plurality of data words transmitted to a communication device over a communication channel having a digital supervisory audio tone (DSAT) and a synchronization pattern, each data word comprising a plurality of bits, the communication device having a message repeat counter, a hole timer for determining a hole time, and a window timer for determining a message window time, the method comprising the steps of:
   a) resetting the message repeat counter and the window timer;
   b) monitoring DSAT for as long as DSAT is received and the message window time is not exceeded;
   c) if DSAT is still received and the message window time is exceeded, repeating from step a;
   d) if DSAT is no longer received, decoding the synchronization pattern;
   e) if the synchronization pattern is not decodable, starting the hole timer and monitoring for DSAT to be received again;
   f) if DSAT is not received again during a predetermined loss time, terminating communication;
   g) if DSAT is received again before the hole time, repeating from step b;
   h) if DSAT is received again after the hole time, repeating from step a;
   i) if the synchronization pattern is decodable, receiving a data word
   j) if the data word is received with one or less bit errors, transmitting an acknowledge word and repeating from step a;
   k) if the data word is received with greater than one bit error, saving the data word and incrementing the message repeat counter;
   l) if the message repeat counter is equal to one, starting the window timer and repeating from step b until the plurality of data words have been received;
   m) if the plurality of data words have been received and the window time is exceeded, repeating from step a;
   n) if the plurality of data words have been received and the window time is not exceeded, performing a bitwise majority vote on the plurality of data words, thereby producing a corrected data word; and
   0) if the corrected data word has one or less bit errors, transmitting the acknowledge word.

2. The method of claim 1 wherein the predetermined loss time is five seconds.

3. The method of claim 1 wherein the plurality of messages is equal to three messages.

4. A method for error correction of a plurality of data words transmitted to a communication device over a communication channel having a digital supervisory audio tone (DSAT) and a synchronization pattern, each data word comprising a plurality of bits, the communication device having a message repeat counter, a hole timer for determining a hole time, and a window timer for determining a message window time, the method comprising the steps of:
   a) resetting the message repeat counter and the window timer;
   b) monitoring DSAT for as long as DSAT is received and the message window time is not exceeded;
   c) if DSAT is still received and the message window time is exceeded, repeating from step a;
   d) if DSAT is no longer received, decoding the synchronization pattern;
   e) if the synchronization pattern is not decodable, starting the hole timer and monitoring for DSAT to be received again;
   f) if DSAT is not received again during a predetermined loss time, terminating communication;
   g) if DSAT is received again before the hole time, repeating from step b;
   h) if DSAT is received again after the hole time, repeating from step a;
   i) if the synchronization pattern is decodable, receiving a data word;
   j) if the data word is received with one or less bit errors, performing a command required by the message and repeating from step a;
   k) if the data word is received with greater than one bit error, saving the data word and incrementing the message repeat counter;
   l) if the message repeat counter is equal to one, starting the window timer and repeating from step b until the plurality of data words have been received;
   m) if the plurality of data words have been received and the window time is exceeded, repeating from step a;
   n) if the plurality of data words have been received and the window time is not exceeded, performing a bitwise majority vote on the plurality of messages, thereby producing a corrected data word; and
   o) if the corrected data word has one or less bit errors, performing a command required by the data word.

5. The method of claim 4 wherein the predetermined loss time is five seconds.

6. The method of claim 4 wherein the plurality of messages is equal to three messages.

* * * * *